Feb. 20, 1973 TOSHIO ABE 3,717,507

METHOD OF MANUFACTURING SEMICONDUCTOR DEVICES UTILIZING IONIMPLANTATION AND ARSENIC DIFFUSION

Filed June 17, 1970 3 Sheets-Sheet 2

3,717,507

METHOD OF MANUFACTURING SEMICONDUCTOR DEVICES UTILIZING ION-IMPLANTATION AND ARSENIC DIFFUSION

Toshio Abe, Yokohama, Japan, assignor to Tokyo Shibaura Electric Co., Ltd., Kawasaki-shi, Japan Filed June 17, 1970, Ser. No. 46,898
Claims priority, application Japan, June 19, 1969, 44/47,950
Int. Cl. H01l 7/00
U.S. Cl. 148—1.5 6 Claims

ABSTRACT OF THE DISCLOSURE

In a method of manufacturing a transistor, the N-type emitter region is formed by diffusing arsenic and the P-type base region is formed by at least injecting ions of an acceptor impurity.

This invention relates to a method of manufacturing a semiconducter device, and more particularly to a method of manufacturing an NPN-type microwave transistor.

As is well known in the art, a transistor for use in a microwave circuit must satisfy the following requirements:

(a) To have an extremely narrow base width (WB),
(b) To have a small emitter region,
(c) To have a small base resistance, that is the number of effective carriers (NC/cm.$^2$) in the base region immediately below the emitter region should be large,
(d) To have a small base-collector capacitance,
(e) To have a small collector series resistance, and
(f) The contact resistances between metal pieces for attaching electrodes and the surfaces of the base region and the emitter region should be low.

Heretofore, an NPN-type silicon planar transistor for use in microwave circuits has generally been manufactured by diffusing boron into an N-type silicon substrate to form a base region and then diffusing phosphorus into this region to form an emitter region in the same manner as the conventional NPN-type silicon planar transistor.

A silicon transistor to be utilized as an amplifier at a given frequency (2 gHz. to 6 gHz.) in the microwave range is required to have an extremely narrow base width (WB) of the order of about 0.1$\mu$. However, by the above described conventional method of manufacturing it is difficult to provide such an extremely narrow base width due to the well-known emitter dip effect. Even if a narrow base width could be obtained by a special method of diffusion, the number of effective carriers immediately beneath the emitter region would be very small or the depth of the emitter junction would be very shallow. In the former case the resulting transistor cannot satisfy the above described requirements of microwave circuits whereas in the latter case it is difficult to satisfactorily bond an electrode metal upon the emitter region, thus resulting in the danger of short circuiting the emitter and base electrodes by the applied metal. For example, when the surface concentration of diffused phosphorus in the emitter region equals $5\times10^{20}$ cm.$^3$, the surface concentration of diffused boron in the base region equals $1\times10^{19}$/cm.$^3$, base width=0.1$\mu$, the depth of the emitter junction equals 0.08$\mu$, and the resistance in the base region immediately below the emitter region equals 20K $\Omega$, that is the number of effective carriers equals $2.5\times10^{12}$/cm.$^3$. The number of effective carriers of this order is believed to be close to the permissible lower limit. With the emitter region having the depth of the emitter junction of the order of 0.08$\mu$ it is difficult to form an electrode with a satisfactory result.

To obviate above described problems a method of forming an emitter region and/or base region by the ion injection or ion implantation method has recently been developed. When compared with the diffusion method, this ion injection method provides a steeper distribution of the impurity, thus generally increasing the number of effective carriers in the base region over that obtained using the diffusion method.

However, even with the method of manufacturing a transistor by the ion injection technique sufficiently satisfactory transistors cannot yet be manufactured. Certain methods of ion injection are defective as follows. In one method wherein a base region is first formed by the injection of boron ions and then an emitter region is formed by the injection of phosphorus ions, the so-called emitter dip effect will be exhibited at the time of injecting phosphorus so that it is impossible to form a base region of a narrow width. As above-mentioned, in a transistor for use in a microwave circuit, as it is necessary to provide a small emitter region it is usual to deposit an electrode metal on the emitter region through openings of a mask utilized to inject phosphorus. With this method, however, only a limited number of ions can reach the regions below the mask, and deposition of the metal tends to short circuit the emitter and base regions. Further, it is necessary to inject a large quantity of phosphorus ions because of the requirement that the impurity concentration in the emitter region should be high. Such an injection of a large quantity of the impurity destroys the crystals in the emitter region. Where the transistor is annealed at a low temperature to remedy such damage of crystals, the current amplification factor of the emitter grounded transistor will be greatly decreased. It is believed that this is caused by the extreme shortening of the life of minority carriers in the emitter region.

According to another prior art method, phosphorus ions are first injected to form an emitter region, the emitter region is heated for a predetermined time to recover the damaged crystals in the emitter region and to rediffuse phosphorus ions in the emitter region so as to expand it laterally to areas immediately beneath the mask and then boron ions are injected to form a base region. If the resulting transistor is subjected to annealing after injection of two types of impurities at a temperature sufficient to eliminate the defects of the crystals caused by the injection of ions so as to provide a high current amplification factor, the final concentration distribution of phosphorus will be nearly equal to that of phosphorus doped by diffusion, thus reducing the advantages of the ion injection method.

According to still another prior method the phosphorus for forming an emitter region is first doped by diffusion and then the boron for forming a base region is doped by the ion injection technique. With this method, since the quantity of the boron to be injected is much smaller than that of the total impurities in the emitter layer the damage of crystals due to injection of boron ions is little so that improvement of the electric characteristics of the layer injected with boron ions can be attained by an annealing treatment carried out at 900° C. for about 10 minutes. In the case, the emitter dip effect is inevitable with such an annealing treatment. For this reason, it is difficult to form a shallow emitter region. It was also found that the transistor formed by this method has the following defects. More particularly, the capacitance between base and collector electrodes is increased so that in spite of narrow emitter width, the product of gain and band width is not improved. Hence the transistor is not suitable for use in microwave circuits. It is believed that the impurity distribution curve of phosphorus doped by the diffusion method intersects at two points the impurity distribution curve of boron doped by the ion injection method. Although it is thought that this phenomenon can be prevented when the depth of the emitter junction is limited to a thickness less than 0.1μ, such a shallow depth renders it difficult to carry out deposition of the electrode.

Accordingly, it is an object of this invention to provide a method of manufacturing a transistor having an excellent high frequency characteristic without the difficulties described hereinabove.

A more specific object of this invention is to provide an improved method of manufacturing a semiconductor device wherein a sharp impurity distribution in the emitter region of a high surface concentration formed by diffusing arsenic and a similar sharp impurity distribution in the base region formed by the injection of ions of an acceptor impurity, for example, boron are utilized to obtain a relatively deep emitter junction and a relatively high carrier concentration in the base region immediately below the emitter region, thus realizing a narrow base width of 0.1μ, for example.

SUMMARY OF THE INVENTION

According to an aspect of this invention there is provided a method of manufacturing a semiconductor device comprising an N-type semiconductor substrate, a P-type base region on one side of the substrate and an N-type emitter region embedded in the base region, said method comprising the steps of forming the emitter region by diffusing arsenic and forming the base region by at least injecting the ions of an acceptor impurity.

Further objects and advantages of the invention can be better understood from the following description when taken in conjunction with the accompanying drawings, in which.

In the method of the present invention, it is not always necessary to introduce all acceptor impurities by the ion injection or ion implantation method in order to form a base region. Alternatively, a base region may be formed by the combination of the ion injection method and the diffusion method so that the total quantity of the acceptor impurities introduced by both methods corresponds to the quantity required to provide the desired impurity concentration. However, the acceptor impurity of a quantity required to provide the desired sharp impurity concentration distribution in at least the base region near the emitter-base junction should be introduced or doped by the ion injection method. It is a matter of choice to first diffuse arsenic to form the emitter region and then inject ions of the acceptor impurity to form the base region or vice versa. More particularly, ions of the acceptor impurity may be injected first to form a base region on a semiconductor substrate and then arsenic may be diffused to form an emitter region. In this case although there is a fear that the impurity concentration distribution of the base region first formed may vary, the result of experiments showed that such variation in the impurity concentration distribution is negligibly small. On the other hand, where the emitter region is first formed by the diffusion of arsenic and then the base region is formed immediately beneath the emitter region by injecting ions of the acceptor impurity, there is no fear of changing the impurity concentration distribution in the emitter region previously formed, thus providing a semiconductor device of good quality since the injection of ions is performed at a low temperature as is well known in the art.

With reference now to FIGS. 1A to 1H and FIG. 2, one embodiment of the method of manufacturing a semiconductor device according to the present invention will be described as follows. To simplify the description and drawing, these figures diagrammatically show only the essential parts of a semiconductor device.

Figure 1A:
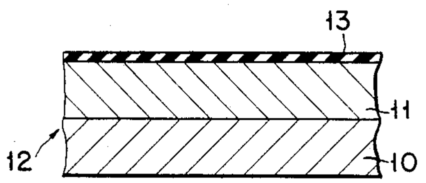
FIGS. 1A to 1H are sectional views to show successive steps of a method of manufacturing an NPN-type transistor according to one embodiment of the invention.
Figure 1E:
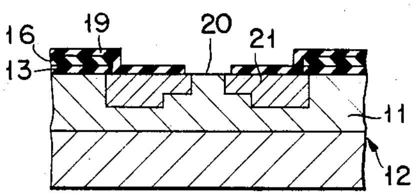
Figure 1B:
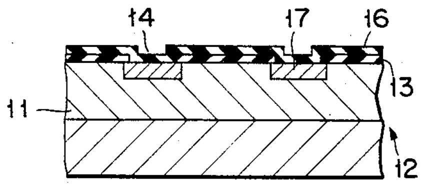
Figure 2:
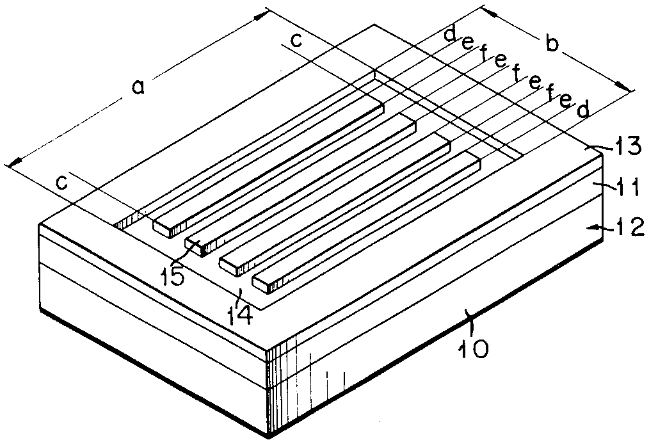
FIG. 2 is a perspective view of a substrate at a step intermediate the steps shown in FIGS. 1A and 1B.

First an $N^+$-conductivity type silicon body 10 is prepared having a specific resistivity of 0.01 ohm-cm. and utilizing a crystal surface at an angle of 6° to 8° with respect to the (111) face as the principal surface. An N-conductivity type layer 11 having a resistivity of 1 ohm-cm. and a thickness of 3μ is formed on the principal surface of body 10 by the epitaxial technique to obtain a semiconductor substrate 12. The substrate is heated in an atmosphere consisting of $SiH_4$, $O_2$ and $N_2$ at a temperature of 450° C. to deposit a silicon dioxide film 13 of 8000 A. thickness on the N-conductivity type layer 11 (FIG. 1A). The substrate 12 is then heated in a nitrogen atmosphere at 1100° C. for 10 minutes to increase the density of film 13. An opening 14 is then formed through the film 13 of increased density by the photo-etching technique. The silicon substrate 12 covered by silicon dioxide film 13 having an opening is then heated in an atmosphere consisting of $SiH_4$, $B_2H_6$, $O_2$ and $N_2$ at a temperature of 450° C. A film of silicon dioxide 16, 2000 A. thick and containing boron is integrally formed on the upper surfaces of film 13 and of the silicon substrate 12 exposed by opening 14. Then the substrate is heated in a nitrogen atmosphere at a temperature of 1100° C. for 30 minutes to diffuse the boron contained in film 13 into the epitaxially grown layer at portions corresponding to the opening 13 to form a boron diffused $P^+$-conductivity type guard ring region having a surface concentration of $2\times10^{20}/cm.^3$ (FIG. 1B). In FIG. 1B although two openings 14 are seen, actually, as shown in FIG. 2 the opening takes the form of a rectangle with four spaced apart stripes of the silicon dioxide film 15 remaining therein. Dimensions of various parts are: $a=62\mu$; $b=49\mu$; $c=3\mu$; $d=7\mu$; $e=5\mu$ and $f=3\mu$.

Figure 1F:
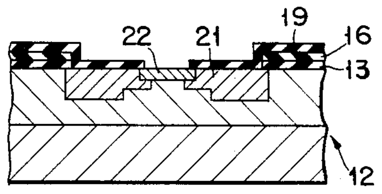
Figure 1C:
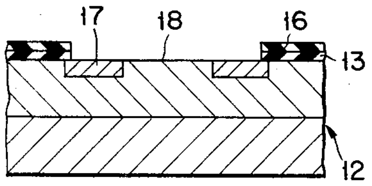

Then both silicon dioxide films 13 and 16 on the substrate 12 are removed by the photo-etching technique at portions required to form a base region, or at portions substantially enclosed by the periphery of opening 14 to form an opening 18 for the base region (FIG. 1C).

Figure 1G:
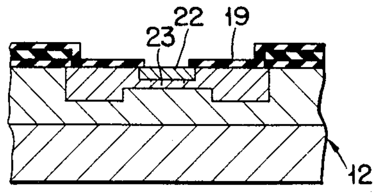
Figure 1D:
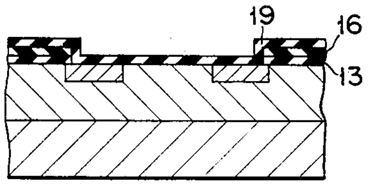

Substrate 12 is then heat treated in an atmosphere consisting of $SiH_4$, $B_2H_6$, $O_2$ and $N_2$ at a temperature of 450° C. to form a film of silicon dioxide 19 having a thickness of 3000 A. and containing boron on the silicon dioxide layer 16 and on the exposed areas of the substrate corresponding to the opening 18 (FIG. 1D). Then portions of the film 19 which form the emitter region or the central portion are removed by the photo-etching technique to form an emitter opening 20. Although only one such opening is shown in FIG. 1E, in the actual transistor, four such openings are formed in parallel, each 1.5μ wide and 50μ long. Then the substrate 12 is heat treated in a nitrogen atmosphere at 1000° C. for 20 minutes to diffuse the boron contained in the film 19 into the area of the N-type conductivity layer 11 immediately below silicon dioxide film 19 to form a P-conductivity type region 21 (FIG. 1E). The substrate is sealed in a quartz tube, 3.5 cm. in inner diameter and 10 cm. long, together with about 100 g. of fine silicon crystals containing arsenic at a concentration of 2 to $3\times10^{20}/cm.^3$ (each crystal has dimensions of about 100μ x 400μ x 400μ) and argon gas under a pressure of 0.22 atmospheric pressure and then heated at a temperature of 1000° C. for 20 minutes to diffuse arsenic through opening 20 to form an N-conductivity type emitter region 22 in the N-conductivity type layer 11 (FIG. 1F). The surface concentration of arsenic in the emitter region 22 is about $1.3\times10^{20}/cm.^3$. The periphery of the emitter region 22 overlaps the P-conductivity type region 21 and the depth of the emitter region 22 is smaller than that of the portions of the P-conductivity type region 21 overlapped with the emitter region 22.

Boron ions are implanted into epitaxially grown layer 11 through the emitter opening 20 and then the substrate 12 is annealed in an argon gas atmosphere at a temperature of 900° C. for 10 minutes to form a P-conductivity type base region 23 to bridge the P-conductivity type region 21 immediately below the emitter region 22 (FIG. 1G). The above described ion injection process is carried out at a normal temperature and in a vacuum, at an accelerating voltage of 30 kv. and a power of 7.4 microcoulomb/cm.$^2$.

The transistor fabricated in this manner has an emitter-base junction depth of about 0.11$\mu$, a base width of about 0.1$\mu$ and a base region resistivity of about 9 K$\Omega$-cm. immediately below the emitter region. From this data it is presumed that the number of effective carriers is equal to about $7\times10^{12}$/cm.$^3$. The depth of the P-conductivity type guard ring region 21 is 1.5$\mu$ at deeper portion and 0.2$\mu$ at shallow portion.

Figure 1H:
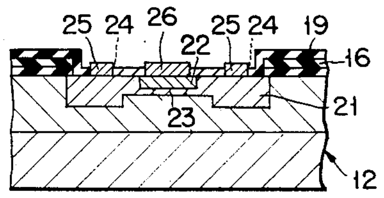

Finally, portions of the silicon dioxide film 19 on the P-conductivity type region 21 are removed to form openings 24 and base electrodes 25 and an emitter electrode 26 are formed on the portions exposed by openings 24 and on the surface of the emitter region 22 to complete a guard ring type NPN-transistor as shown in FIG. 1H. Five openings 24 are formed, each having a width of 3$\mu$ and a length of 50$\mu$.

The transistor fabricated by the method described above has a small base resistance irrespective of its narrow base region. This greatly improves the power gain and the noise coefficient in the microwave range. When operating at a frequency of 2 gHz., a power gain of 12 db was obtained for a collector current of 10 ma. and a noise figure of 2.5 db was obtained for a collector current of 5 ma. By way of comparison, a transistor fabricated by the prior art method manifested a power gain of only 10 db and a noise figure of 5 db.

The sharp or abrupt impurity concentration distribution in the base region of a device fabricated according to the invention results in an increase of the gain-band width-integration since the delay field to be occurred in the base region and therefore the base running time decreases. From this it will be clear that the transistor fabricated according to the method of this invention has improved power gain and noise characteristics when compared with the prior art transistor.

Figure 3E:
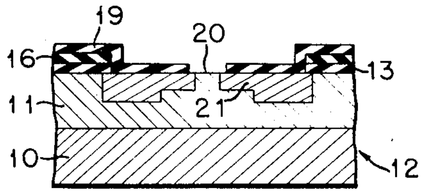
FIGS. 3E to 3G show modified process steps.
Figure 3F:
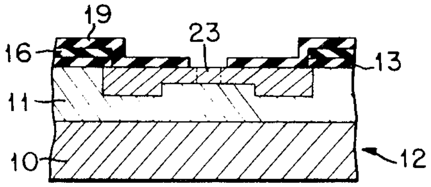
Figure 3G:
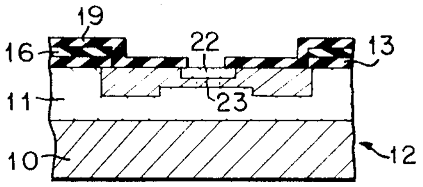

FIGS. 3E to 3G show a modified embodiment of this invention. In this embodiment, process steps up to the step shown in FIG. 1E are substantially the same as those shown in FIG. 1 so that the steps shown in FIGS. 3E to 3G alone are described. Portions corresponding to the same portions shown in FIG. 1 are designated by the same reference numerals. Again a semiconductor substrate 12 is comprised by an N+-conductivity type semiconductor body 10 and an N-conductivity type layer 11 epitaxially grown thereon. A silicon dioxide film 13 having an opening at its center is provided together with films 16 and 19 of silicon dioxide containing boron which is diffused into layer 11 to form a P-conductivity type region 21. An opening 20 for forming an emitter region is provided at the center of film 19. Boron ions are injected into the semiconductor substrate through opening 20 under the same conditions as in the previous embodiment to form a base layer 23 bridging the P-conductivity type region (FIG. 3F). The assembly is then annealed by heating it under conditions which do not cause appreciable rediffuson of the boron injected into the substrate (a certain degree of rediffusion may be permitted so long as it does not substantially affect the characteristics of the resulting semiconductor device), for example at a temperature of 900° C. for 10 minutes, to remedy the defects of the lattice created by the injection of ions. Although this annealing step is not essential this step makes it easy to control the depth of the diffused arsenic for forming an emitter region. Then arsenic is diffused through opening 20 to form an emitter region 22 in the base region 23 to complete a planar transistor.

By this method, although there is a tendency that the impurity concentration distribution in the base region doped with boron ions varies somewhat during diffusion of arsenic, it is advantageous to make sufficiently high the carrier concentration when compared with the device wherein the boron for forming the base region is doped by diffusion as in the prior method. It will be readily understood that the emitter dip effect will not be exhibited because arsenic is diffused to form the emitter region.

While in the above embodiments the P-conductivity type layer was formed by diffusing the boron doped in the silicon dioxide film, it can also be formed by the conventional gaseous phase diffusion method utilizing $BBr_3$ or $B_2O_3$ as the source of impurity. Further it is to be understood that the acceptor impurity for forming the P-conductivity type region and the base region is not limited to boron and that other acceptor impurities such as aluminium and gallium can also be used.

Instead of forming the base layer by the ion injection method the base region can also be formed by diffusing the acceptor impurity for forming the P-conductivity type layer into portions where the base region is to be formed and then doping them with the acceptor impurity by the ion injection method. This method decreases the chance of punch through of the base region immediately beneath the emitter periphery.

Instead of forming the base region by the gaseous phase diffusion of boron as in the above described embodiments, the base region can also be formed by diffusing boron which has been doped in the silicon dioxide film.

Figure 4E:
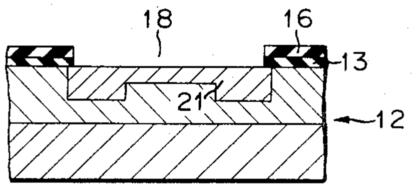
FIGS. 4E and 4F show further modified process steps.
Figure 4F:
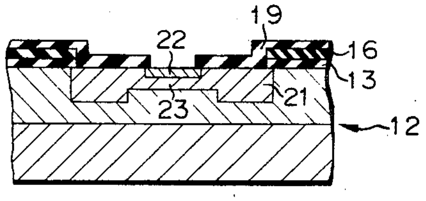

FIGS. 4E and 4F show a further modification of the invention wherein the preceding steps are subsantially the same as those illustrated in FIGS. 1A to 1C and therefore the detailed description of these steps is omitted. Boron is diffused into a substrate 12 at an opening perforated in insulating layers 13 and 16 to form a P-type continuous region 21 on the side of the substrate which has a surface concentration of $3\times10^{12}$/cm.$^2$ (FIG. 4E). The exposed surface of the substrate and insulating film are covered with a new silicon dioxide film 19 and then the central portion thereof is etched to form an opening 20 exposing the corresponding portion of the substrate. Arsenic is then diffused into the P-type region 21 through the opening 20 to form an emitter region 23 (FIG. 4F). Through the opening 20 boron $7\times10^{12}$/cm.$^2$ is further implanted into the substrate to form a base layer 23 beneath the emitter region 22, of which the final surface concentration is $1\times10^{13}$/cm.$^2$.

In the above modification the emitter layer may be formed after the implanting formation of the base region.

The P-type and base regions may be formed simultaneously using the ion implantation process. For example, in the step shown in FIG. 1C, an insulating film is covered on the exposed surface of the substrate, which has an opening on the portion of the substrate where an emitter region will be formed and a thin peripheral portion near the opening, and then into the substrate boron is implanted through the opening and thin portion to form a base layer and P-type region.

Instead of silicon, other semiconductor materials may be used as a semiconductor substrate.

The mask utilized to dope the impurity into the substrate for forming the base region or the emitter region may also be made of silicon nitride film, a metal film or any material or combinations thereof commonly utilized in the art.

What is claimed is:

1. A method of manufacturing a semiconductor device comprising a step of forming N-type emitter and P-type base regions in an N-type semiconductor substrate, the emitter region being disposed in the base region, characterized in that said emitter region is formed by diffusing arsenic and the portion of the base region under the emitter region is formed at least in part by ion-implanting acceptor impurities.

2. A method according to claim 1 wherein said base region is formed prior to said emitter region by ion-implanting acceptor impurities into one side of said semconductor substrate to form said base region therein; and said emitter region is formed by diffusing arsenic into said base region to form said emitter region therein.

3. A method according to claim 1 wherein said base region is formed by diffusing acceptor impurities into said semiconductor substrate to form a ring shaped P-type region therein; and ion-implanting acceptor impurities into said semiconductor substrate to form a P-type base layer with its peripheral portion overlapping the inner portion of said ring shaped P-type region.

4. A method according to claim 1 comprising diffusing acceptor impurities into one side of said semiconductor substrate to form a ring shaped P-type region therein; diffusing arsenic into said one side of said semiconductor to form said emitter region with its peripheral portion overlappng the inner portion of said ring shaped P-type region; and then ion-implanting acceptor impurities through said emitter region to form said base region therebeneath.

5. A method according to claim 1 comprising diffusing acceptor impurities into one side of said semiconductor substrate to form a P-type region therein; diffusing arsenic into said one side of said semiconductor substrate to form said emitter region in said P-type region; and ion-implanting acceptor impurities through said emitter region to form said base region therebeneath.

6. A method according to claim 1 comprising diffusing and ion-implanting acceptor impurities into one side of said semiconductor substrate to form said base region therein; and diffusing arsenic into one side of said base region to form said emitter region therein.

References Cited

UNITED STATES PATENTS

| | | | |
|---|---|---|---|
| 3,523,042 | 8/1970 | Bower et al. | 148—1.5 |
| 3,028,655 | 4/1962 | Dacey et al. | 148—189 X |
| 3,574,009 | 4/1971 | Chizimsky et al. | |
| 3,064,167 | 11/1962 | Hoermi | 148—189 X |

OTHER REFERENCES

Toshiba: "Electronics," p. 226, Sept. 15, 1969.

EARL C. THOMAS, Primary Examiner

J. COOPER, Assistant Examiner

U.S. Cl. X.R.

148—186, 189; 317—235 R